US009730342B2

(12) United States Patent
Lee et al.

(10) Patent No.: US 9,730,342 B2
(45) Date of Patent: Aug. 8, 2017

(54) DISPLAY APPARATUS

(71) Applicant: SAMSUNG ELECTRONICS CO., LTD., Suwon-si (KR)

(72) Inventors: Dong Yup Lee, Anseong-si (KR); Jae Hoo Park, Suwon-si (KR); Gyu Sung Do, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 155 days.

(21) Appl. No.: 14/590,168

(22) Filed: Jan. 6, 2015

(65) Prior Publication Data
US 2015/0195932 A1    Jul. 9, 2015

(30) Foreign Application Priority Data

Jan. 6, 2014  (KR) .................. 10-2014-0001519
Nov. 10, 2014 (KR) .................. 10-2014-0155574

(51) Int. Cl.
*G11B 33/02*    (2006.01)
*H05K 7/00*     (2006.01)
*H05K 5/02*     (2006.01)
*H05K 5/00*     (2006.01)
*H05K 5/03*     (2006.01)
*H04N 5/64*     (2006.01)
*G02F 1/1333*   (2006.01)

(52) U.S. Cl.
CPC ............ *H05K 5/0217* (2013.01); *H04N 5/64* (2013.01); *H05K 5/0017* (2013.01); *H05K 5/03* (2013.01); *G02F 1/133305* (2013.01); *G02F 2001/133322* (2013.01)

(58) Field of Classification Search
CPC ................................... G09G 3/3225

USPC ..................................... 361/679.01
See application file for complete search history.

(56) References Cited

U.S. PATENT DOCUMENTS

| 2013/0037228 A1 | 2/2013 | Verschoor et al. |
| 2013/0114193 A1 | 5/2013 | Joo et al. |
| 2013/0207946 A1 | 8/2013 | Kim et al. |
| 2015/0035812 A1* | 2/2015 | Shin ............. G09G 3/3688 345/204 |

FOREIGN PATENT DOCUMENTS

| KR | 10-2013-0070423 A | 6/2013 |
| KR | 10-2013-0138614 A | 12/2013 |

OTHER PUBLICATIONS

Communication dated Mar. 30, 2015 issued by the International Searching Authority in counterpart International Patent Application No. PCT/KR2015/000114.

* cited by examiner

*Primary Examiner* — Jerry Wu
(74) *Attorney, Agent, or Firm* — Sughrue Mion, PLLC

(57) ABSTRACT

Disclosed herein is a display apparatus including: a display module configured to be changed to a curved state, the display module comprising a first lateral edge and a second lateral edge, the first and the second lateral edges protruding forward in the curved state; a base frame disposed behind the display module; a shield member rotatably connected to lateral ends in a widthwise direction of the display module; and a cover unit having a first end connected to the shield member and a second end opposite from the first end connected to the base frame and configured to spread and cover spaces between the display module and the base frame at the lateral ends of the display unit when the display module is in the curved state.

22 Claims, 16 Drawing Sheets

DISPLAY APPARATUS

CROSS-REFERENCE TO RELATED APPLICATION

This application claims priority from Korean Patent Applications No. 10-2014-0001519 and No. 10-2014-0155574, filed on Jan. 6, 2014 and Nov. 10, 2014, respectively, in the Korean Intellectual Property Office, the disclosures of which are incorporated herein by reference in their entireties.

BACKGROUND

1. Field

Apparatuses consistent with exemplary embodiments relate to a display apparatus with a display module that can be transformed to a flat state or a curved state.

2. Description of the Related Art

In the related art, a display apparatus includes a display module to display images. Examples of the display apparatus may include a television and a monitor.

Lately, a display apparatus with a display module in which a display panel is fixed in a curved state so that a user can feel a three (3)-dimensional (3D) effect to some degrees while watching two (2)-dimensional (2D) images as if he/she sees 3D images has been developed.

However, some users still prefer a display module in a flat state rather than in a curved state. Also, there are cases in which users feel more comfortable when seeing images through a display module in a flat state than through a display module in a curved state, under specific conditions, such as when various kinds of contents are displayed or when there are a large number of users.

For these reasons, a display apparatus with a display module that can be transformed to a flat state or a curved state is suggested.

SUMMARY

One or more exemplary embodiments provide a display apparatus with a display module that can be transformed to a flat state or a curved state, which is capable of preventing foreign materials from getting into the display apparatus through spaces between the display module and a case when the display module is in the curved state.

Additional aspects of the disclosure will be set forth in part in the description which follows and, in part, will be obvious from the description, or may be learned by practice of the disclosure.

In accordance with an aspect of an exemplary embodiments, there is provided a display apparatus including: a display module that is able to be transformed to a curved state in which both lateral edges of the display module protrude forward; a base frame disposed behind the display module; one or more shield members rotatably connected to both lateral ends of the display module; and one or more cover units having one ends connected to the shield members and the other ends connected to the base frame, and configured to spread when the display module is transformed to a curved state, thus covering spaces between both sides of the display module and the base frame when the display module is in the curved state.

Each of the one or more cover units may include a plurality of cover members that are formed in a shape of plates extending in a widthwise direction of the display module and that are stacked vertically, and the plurality of cover members may have one ends rotatably and movably connected to the base frame and the other ends rotatably connected to the shield members.

The one or more shield members may include a first shield member and a second shield member respectively connected to both lateral ends of the display module, and the one or more cover units may include one or more first cover units and one or more second cover units, wherein the first cover units have one ends connected to a center part to the base frame and the other ends connected to the first shield member to cover at least one portion of the upper and lower portions of spaces between a part of the display module and the side case when the display module is in the curved state, and the second cover units have one ends connected to the center part to the base frame and the other ends connected to the second shield member to cover at least one portion of the upper and lower portions of spaces between the other part of the display module and the side case when the display module is in the curved state.

The base frame may include one or more first guide pins configured to movably and rotatably support one ends of the cover members of the first cover units, and one or more second guide pins configured to movably and rotatably support one ends of the cover members of the second cover units, each of the first shield member and the second shield member may include a plurality of hinge grooves with which the other ends of the cover members are rotatably coupled, and the cover members may have one ends in which a plurality of guide holes extending horizontally and passing the guide pins therethrough are formed, and the other ends in which a plurality of hinge protrusions rotatably coupled with the hinge grooves are formed.

The first guide pins and the second guide pins may be formed in at least one part of the upper, center part and the lower, center part of the base frame, and the hinge grooves may be formed in at least one ends of the upper ends and the lower ends of the first shield member and the second shield member.

The plurality of cover units may include a pair of first cover units configured to cover the upper and lower portions of spaces between a part of the display module and the side case when the display module is in the curved state, and a pair of second cover units configured to cover the upper and lower portions of spaces between the other part of the display module and the side case when the display module is in the curved state.

The plurality of cover units may include a first cover unit configured to cover the upper portion of spaces between a part of the display module and the side case when the display module is in the curved state, and a second cover unit configured to cover the upper portion of spaces between the other part of the display module and the side case when the display module is in the curved state.

The display apparatus may further include a side case configured to cover the upper, lower, left, and right sides of the display module when the display module is in a flat state, wherein the one or more cover units cover at least ones of the upper and lower portions of spaces between the display module and the side case when the display module is in the curved state.

The display apparatus may further include a transform unit disposed on the base frame and configured to transform the display module, and a rear case disposed behind the base frame and configured to cover the transform unit, wherein a height of the rear case may be lower than a height of the display module.

The transform unit may include a driver configured to generate power, a pair of moving members configured to move in opposite directions by the driver, and a plurality of rotating members rotatably connected to the pair of moving members, and configured to rotate according to movements of the moving members to move both lateral edges of the display module forward and backward.

In accordance with an aspect of an exemplary embodiments, there is provided a display apparatus including: a display module configured to be changed to a curved state, the display module comprising a first lateral edge and a second lateral edge, the first and the second lateral edges protruding forward in the curved state; a base frame disposed behind the display module; a shield member rotatably connected to lateral ends in a widthwise direction of the display module; and a cover unit having a first end connected to the shield member and a second end opposite from the first end connected to the base frame and configured to spread and cover spaces between the display module and the base frame at the lateral ends of the display unit when the display module is in the curved state.

The cover unit may include a plurality of cover members having a shape of a plate extending in a widthwise direction of the display module and stacked vertically, and a cover member of the plurality of cover members may include a first end rotatably and movably connected to the base frame and a second end rotatably connected to the shield members.

The shield member may include a first shield member and a second shield member respectively connected to corresponding lateral ends of the display module, and wherein the cover unit may include a first cover unit and a second cover unit, wherein the first cover unit may include a first end connected to a center part of the base frame and a second end connected to the first shield member and is configured to cover at least one portion of upper and lower portions of spaces between the display module and a side case at a first lateral end of the lateral ends when the display module is in the curved state, and wherein the second cover unit may include a first end connected to the center part to the base frame and a second end connected to the second shield member and is configured to cover at least one portion of upper and lower portions of spaces between the display module and the side case at a second lateral end opposite to the first lateral end when the display module is in the curved state.

The base frame may include a first guide pin configured to movably and rotatably support a first end of the plurality of cover members of the first cover unit, and a second guide pin configured to movably and rotatably support a first end of the plurality of cover members of the second cover unit, the first shield member may include a plurality of hinge grooves with which a second end of the plurality of cover members of the first cover unit is rotatably coupled and the second shield member may include a plurality of hinge grooves with which a second end of the plurality of cover members of the second cover unit is rotatably coupled, and the first ends of the plurality of cover members of the first and second cover units may include a guide hole extending horizontally and through which respective first and second guide pins pass therethrough, and a second end of the plurality of cover members of the first and second cover units may include a hinge protrusion rotatably coupled with respective plurality of hinge grooves of the first and second shield members.

The first guide pin and the second guide pin may be provided in at least one of an upper-center part and a lower-center part of the base frame, and the plurality of hinge grooves are provided in at least one of an upper end and a lower end of the first and second shield members.

The cover unit may include: a pair of first cover units configured to cover the upper and lower portions of spaces between the display module and the side case at the first lateral end when the display module is in the curved state; and a pair of second cover units configured to cover the upper and lower portions of spaces between the display module and the side case at the second lateral end when the display module is in the curved state.

The cover unit may include: a first cover unit configured to cover the upper portion of spaces between the display module and the side case at the first lateral end when the display module is in the curved state; and a second cover unit configured to cover the upper portion of spaces between the display module and the side case at the second lateral end when the display module is in the curved state.

The display apparatus may further include a side case configured to cover top, bottom, left, and right side surfaces of the display module when the display module is in a flat state, wherein the cover unit may be configured to cover at least one of the upper and lower portions of spaces between the display module and the side case when the display module is in the curved state.

The display apparatus may further include a transform unit provided on the base frame and configured to transform the display module, and a rear case disposed behind the base frame and configured to cover the transform unit, wherein a height of the rear case may be smaller than a height of the display module.

The transform unit may include: a driver configured to generate power; a pair of moving members configured to move in opposite directions from each other by the driver; and a plurality of rotating members rotatably connected to the pair of moving members and configured to rotate according to movements of the moving members to move the first and second lateral edges of the display module forward or backward.

In accordance with an aspect of an exemplary embodiments, there is provided a display apparatus including: a display device including: a first surface configured to display an image; and a second surface opposite to the first surface; a base member provided on the second surface of the display device; a side case encasing the display device and the base frame; a shield device provided at first and second lateral ends in a widthwise direction of the display device in an interior of the side case and extending in a height-wise direction of the display device; and a cover device provided in the interior of the side case having a first end connected to the shield member and a second end opposite from the first end connected to the base frame, wherein when the display device is in a flat state, the side case provides outer surfaces of the display apparatus and wherein when the display device is in a curved state, the side case, the shield device and the cover device together provide the outer surfaces of the display apparatus.

The shield device may include a first shield device provided at a first lateral end of the display device and a second shield device provided at a second lateral end opposite to the first lateral end of the display device.

The cover device may include: a pair of first cover devices configured to cover upper and lower portions of gaps between the display device and the side case at the first lateral end when the display device is in the curved state; and a pair of second cover devices configured to cover upper and lower portions of gaps between the display device and the side case at the second lateral end when the display device is in the curved state.

The cover device may include a plurality of cover members, and wherein when the display device is in the flat state, the plurality of cover members may be stacked and overlapped with one another in the widthwise direction of the display device and wherein when the display device is in the curved state, the plurality of cover members may be configured to spread in a fan shape and form the outer surfaces of the display apparatus.

When the display device is in the curved state, the shield device may be configured to provide a vertical surface extending in the height-wise direction of the outer surfaces and the cover device may be configured to provide a horizontal outer surface extending perpendicularly from the vertical surface of the outer surfaces of the display apparatus.

The first end of the cover device may include a plurality of hinge protrusions protruding in the height-wise direction and the shield device may include a plurality of hinge grooves corresponding to the plurality of hinge protrusions and configured to rotatably support the first end of the cover device.

The plurality of hinge grooves may be provided in at least one of an upper-most end and a lower-most end in the height-wise direction of the shield device.

The second end of the cover device may include a guide hole and the base frame may include a guide pin corresponding to the guide hole and configured to movably and rotatably support the second end of the cover device.

The guide pin may be provided in at least one of an upper-center part and a lower-center part of the base frame.

The display apparatus may further include a transform unit provided on the base frame and configured to transform the display device between the flat state and the curved state.

In accordance with an aspect of an exemplary embodiments, there is provided a display apparatus including: a display means configured to display an image; transforming means for transforming the display means between a flat state and a curved state; casing means for providing outer surfaces of the display means; and covering means for covering a gap created between the display means and the casing means when the display means is in the curved state.

The covering means may include: a first covering means for covering a vertical outer surface of the gap between the display means and the casing means; and a second covering means for covering a horizontal outer surface of the gap between the display means and the casing means.

BRIEF DESCRIPTION OF THE DRAWINGS

The above and/or other aspects of the disclosure will become apparent and more readily appreciated from the following description of exemplary embodiments, taken in conjunction with the accompanying drawings of which.

DETAILED DESCRIPTION

Figure 1:
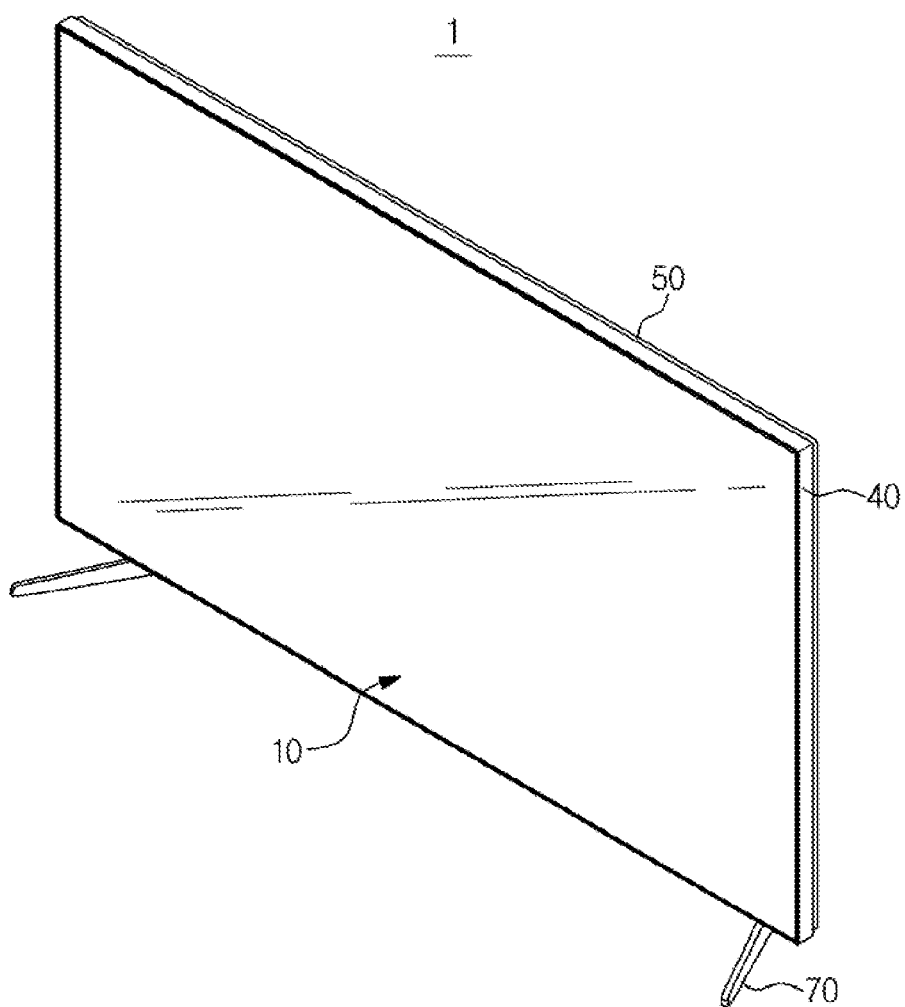
FIG. 1 is a perspective view of a display apparatus according to an exemplary embodiment, when a display module is in a flat state.

Reference will now be made in detail to exemplary embodiments, examples of which are illustrated in the accompanying drawings, wherein like reference numerals refer to like elements throughout.

Hereinafter, a display apparatus 1 according to an exemplary embodiment will described with reference to the accompanying drawings.

Figure 2:
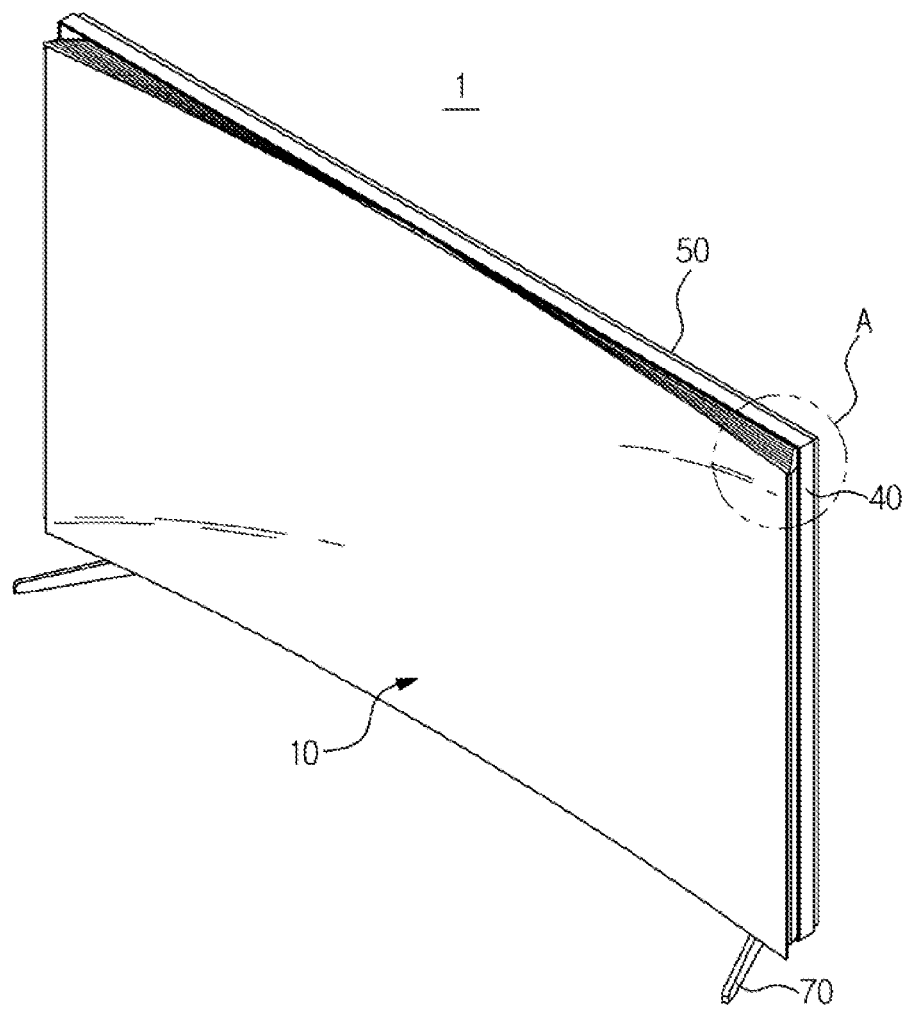
FIG. 2 is a perspective view of the display apparatus according to an exemplary embodiment, when the display module is in a curved state.

The display apparatus 1 according to an exemplary embodiment may include a display module 10 that can be transformed to a curved state in which both lateral edges of the display module 10 protrude forward. The display module 10 can be transformed to a flat state, as shown in FIG. 1, and to a curved state in which both lateral edges of the display module 10 protrude forward at a predetermined curvature, as shown in FIG. 2.

Figure 3:
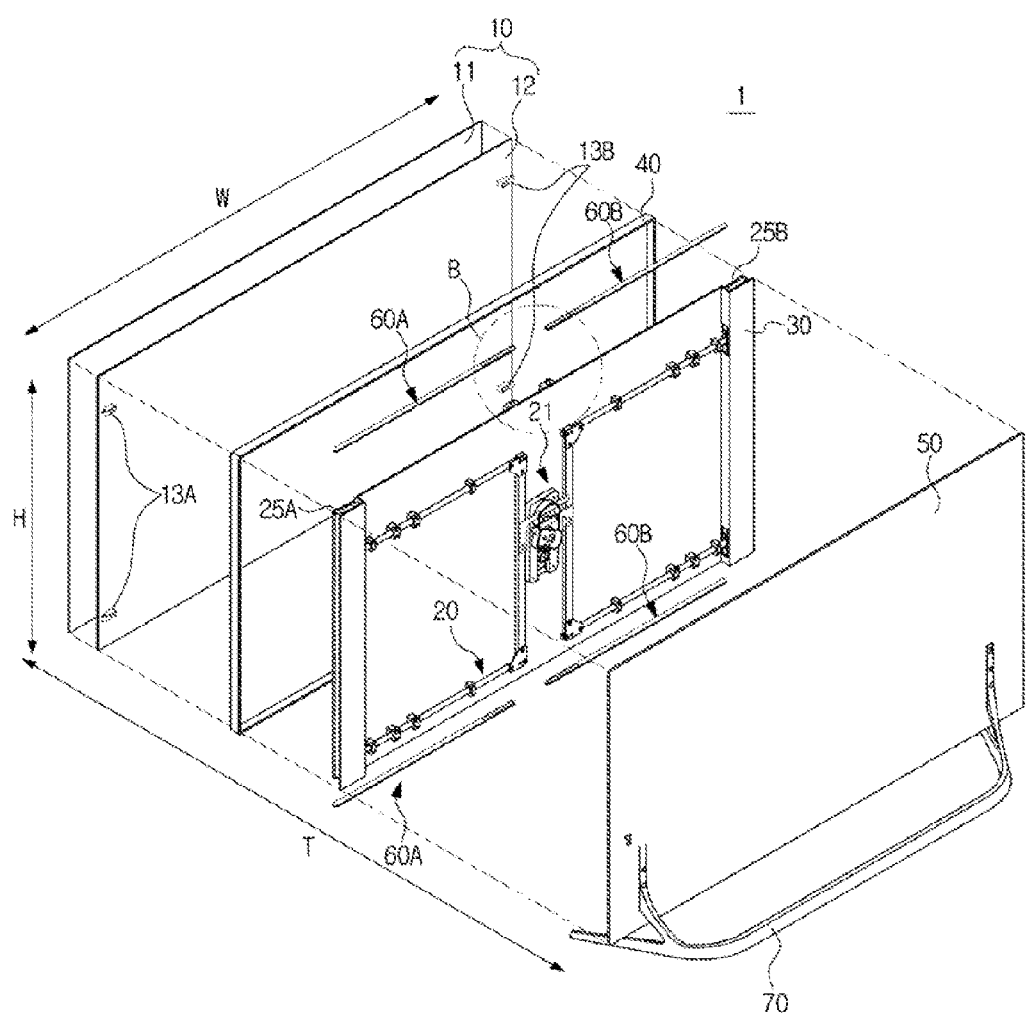
FIG. 3 is an exploded perspective view of the display apparatus according to an exemplary embodiment.
Figure 4:
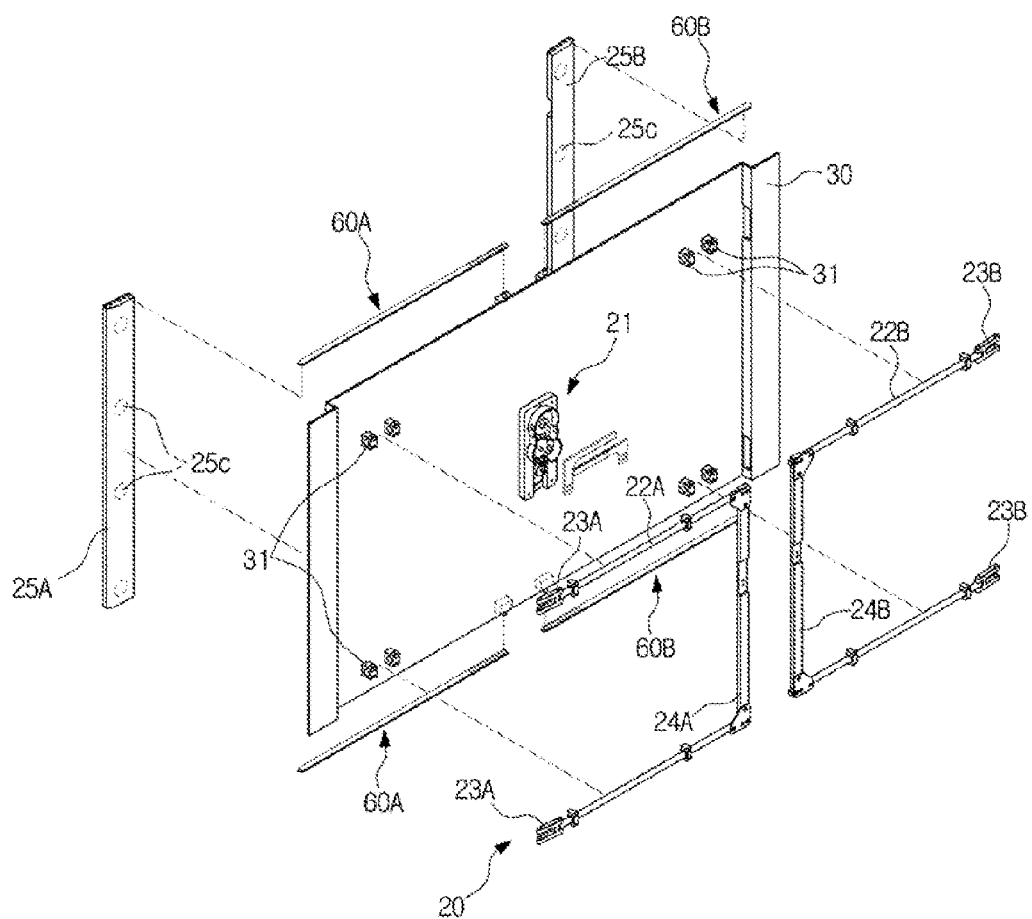
FIG. 4 is an exploded perspective view of the display apparatus according to an exemplary embodiment, showing an installation state of a transform unit.

The display apparatus 1 may include, as shown in FIGS. 3 and 4, the display module 10 which can be transformed to a flat state and a curved state, a transform unit 20 configured to change (e.g., transform) the display module 10 to the flat state and the curved state as described above, a base frame 30 which is disposed behind the display module 10 and on which the transform unit 20 is positioned, a side case 40 forming side surfaces of the display apparatus 1, a rear case 50 forming a rear part of the display apparatus 1, and a stand 70 which is removably attached on the rear case 50 and which enables the display apparatus 1 to stand upright. In an exemplary embodiment, the side case 40 is a casing means and the casing means provides outer surfaces of the display device as described above.

The display module 10 may include a display panel 11 being an Organic Light Emitting Diode (OLED) panel, and a support panel 12 shaped to correspond to the display panel 11 and configured to support the rear part of the display panel 11.

The transform unit 20 may transform the display module 10 to a flat state in which the display module 10 is flat, or to a curved state in which both lateral edges of the display module 10 protrude forward from the center part of the display module 10, so that the display module 10 can be used in the flat state or in the curved state. In an exemplary embodiment, the transforming unit is an example of transforming means. Yet in another exemplary embodiment, the transforming means transforms the display device between a flat state and a curved state as described above.

The transform unit 20 may include a driver 21 disposed on the rear, center part of the display module 10 and configured to transform both lateral edges of the display module 10, a plurality of first moving members 22A and a plurality of second moving members 22B configured to receive power from the driver 21 and to move in opposite directions symmetrically from the driver 21, and a plurality of rotating members 23A and 23B configured to rotate according to movements of the plurality of first and second moving members 22A and 22B to move both lateral edges of the display module 10 forward and backward.

Figure 5:
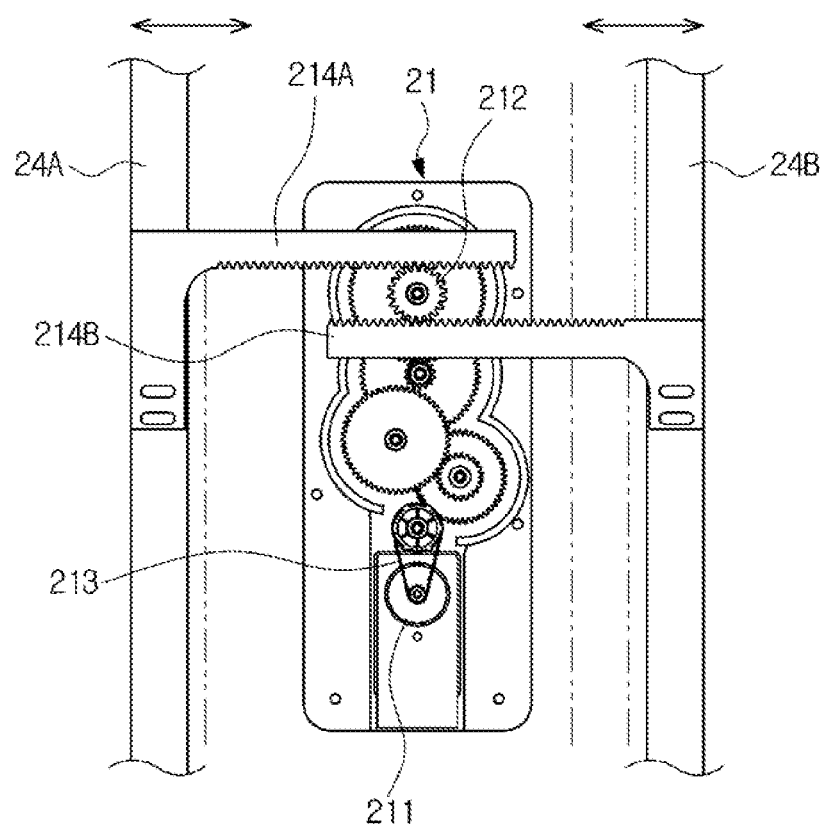
FIG. 5 is a rear view of a driving unit in a display apparatus according to an exemplary embodiment.

The driver 21 may include, as shown in FIG. 5, a driving motor 211 to generate rotatory power, a pinion 212 to rotate by receiving rotatory power generated by the driving motor 211 through power transfer members, such as gears or belts, and a first rack 214A and a second rack 214B configured to interlock with the upper and lower parts of the pinion 212 and to move in opposite directions.

Referring to FIGS. 3, 4, and 5, the plurality of first moving members 22A receive power through the first rack 214A of the driver 21 and to move linearly in a widthwise direction W of the display module 10, and the plurality of second moving members 22B receive power through the second rack 214B of the driver 21 and to move linearly in a direction that is opposite to the direction in which the first moving members 22A move. In one exemplary embodiment, the widthwise direction includes any direction parallel with a width of the display module 10.

The plurality of rotating members 23A and 23B may include a plurality of first rotating members 23A where first ends of respective first rotating members 23A are rotatably connected to the first moving members 22A and where second ends of the respective first rotating members 23A are rotatably connected to a first lateral edge of the display module 10 in the widthwise direction to rotate according to movements of the first moving members 22A to move the first lateral edge of the display module 10 forward or backward in a thickness-wise-wise direction T of the display module 10, and a plurality of second rotating members 23B where first ends of respective second rotating members 23B are rotatably connected to the second moving members 22B and where second ends of the respective second rotating members 23B are rotatably connected to a second lateral edge of the display module 10 in the widthwise direction that is opposite to the first lateral edge to rotate according to movements of the second moving members 22B to move the second lateral edge of the display module 10 forward or backward in the thickness-wise-wise direction T of the display module 10.

In the exemplary embodiment, the first moving members 22A may be two moving members 22A that are spaced apart from each other in a vertical direction (i.e. a height-wise direction H of the display module 10) and move together in the widthwise direction of the display module 10 as the two moving members 22A are connected through a first connecting member 24A extending vertically in the height-wise direction H as shown in FIG. 4. Also, the second moving members 22B may be two moving members 22B that are spaced apart from each other in the vertical direction and move together as the two moving members 22B are connected through a second connecting member 24B extending vertically in the height-wise direction H as shown in FIG. 4.

Meanwhile, at the first lateral edge on the rear of the display module 10 in the thickness-wise-wise direction T of the display module 10, a pair of first hinge members 13A (see FIG. 8), with which the second ends of the respective first rotating members 23A are rotatably coupled, may be spaced apart from each other in the vertical direction. Similarly, at the second lateral edge on the rear of the display module 10, a pair of second hinge members 13B, with which the second ends of the second rotating members 23B are rotatably coupled, may be spaced apart from each other in the vertical direction.

Also, the display apparatus 1 may include a pair of shield members 25A and 25B to cover side portions of spaces between the side case 40 and the first and second lateral edges of the display module 10 which protrude forward in the thickness-wise-wise direction T of the display module 10 when the display module 10 is in the curved state.

The pair of shield members 25A and 25B may include a first shield member 25A extending vertically (i.e., in a height-wise direction H of the display module 10) and rotatably disposed at a first lateral end in a widthwise direction W of the display module 10 behind the display module 10 in the thickness-wise-wise direction T of the display module 10, and a second shield member 25B extending vertically (i.e., in the height-wise direction H of the display module 10) and rotatably disposed at a second lateral end in the widthwise direction W of the display module 10 behind the display module 10.

The first and second shield members 25A and 25B may rotate with respect to an axis extending in the height-wise direction H of the display module 10 when the display module 10 is transformed between a curved state and a flat state, thus at least partially covering the side portions of spaces between the display module 10 and the side case 40 when the display module is in the curved state. In the exemplary embodiment, the first shield member 25A may connect to the first rotating members 23A such that the first shield member 25A is rotatably installed at the first lateral end on the rear of the display module 10 through the first rotating members 23A, and the second shield member 25B may connect to the second rotating members 23B such that the second shield member 25B is rotatably installed at the second lateral end on the rear of the display module 10 through the second rotating members 23B.

Each of the first and second shield members 25A and 25B may include a plurality of speakers 25 aligned vertically (i.e., in the height-wise direction H of the display module 10) so that the first and second shield members 25A and 25B may function as speakers. The above described shield members 25A and 25B are examples of covering means and the shield members 25A and 25B cover a gap created between the display module 10 and the side case 40.

The base frame 30 may be formed in a shape of a rectangular plate to correspond to a shape of the display module 10, and disposed behind the display module 10 in the thickness-wise-wise direction T of the display module 10. The driver 21 may be fixed at the center part of the base frame 30. Also, the center part of the display module 10 may be fixed on the base frame 30 in order to prevent the center part of the display module 10 from moving forward along with the lateral ends of the display module 10.

The two first moving members 22A may connect to the first rack 214A through the first connecting member 24A to move together with the first rack 214A, and the two second moving members 22B may connect to the second rack 214B through the second connecting member 24B to move together with the second rack 214B.

A plurality of movement guides 31 for guiding horizontal movement (i.e., along the widthwise direction W of the display module 10) of the first moving members 22A and the second moving members 22B may be arranged on the base frame 30. In the exemplary embodiment, four pairs of movement guides 31 may be arranged on the base frame 30 such that each of the first and second moving members 22A and 22B is movably supported by a pair of movement guides 31. However, the exemplary embodiment is not limited thereto. The number of the movement guides is not particularly limited and may be adjusted based on the design criteria of the display apparatus 1.

The side case 40 may be formed in a shape of a rectangular ring or a rectangular enclosure to cover the top, bottom, left, and right side surfaces of the display module 10 and the base frame 30 when the display module 10 is in the flat state. If the display module 10 is transformed to the curved state, both lateral edges (i.e., the first and second lateral edges) of the display module 10 may protrude forward from the side case 40 in the thickness-wise direction T of the display module 10.

Also, the display apparatus 1 may include a plurality of cover units 60A and 60B to cover upper and lower portions of spaces created between the display module 10 and the side case 40 or the base frame 30 when the display module 10 is in the curved state at the both lateral ends of the display module 10 in the widthwise direction W.

In the exemplary embodiment, the cover units 60A and 60B may include a pair of first cover units 60A where first ends of respective first cover units 60A are connected to the center part of the base frame 30 and where second ends of the respective first cover units 60A are connected to the first shield member 25A to cover the upper and lower portions of spaces between the display module 10 and the side case 40 or the base frame 30 at the first lateral end corresponding to a location of the first shield member 25A when the display module 10 is transformed into the curved state, and a pair of second cover units 60B where first ends of respective second cover units 60B are connected to the center part of the base frame 30 and where second ends of the respective second cover units 60B are connected to the second shield member 25B to cover the upper and lower portions of spaces between the display module 10 and the side case 40 or the base frame 30 at the second lateral end corresponding to a location of the second shield member 25B when the display module 10 is transformed into the curved state.

Figure 6:
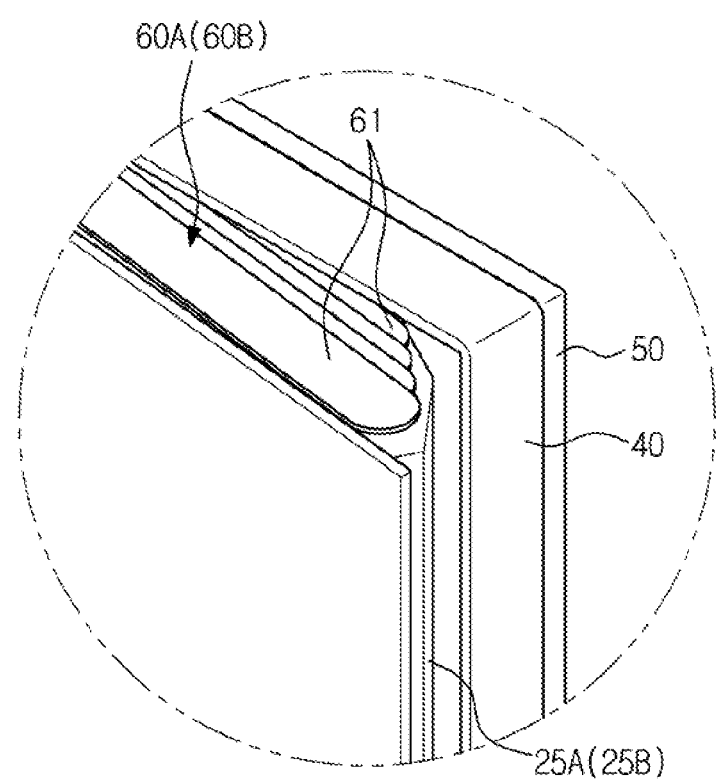
FIG. 6 is an enlarged view of a part A of FIG. 2.
Figure 7:
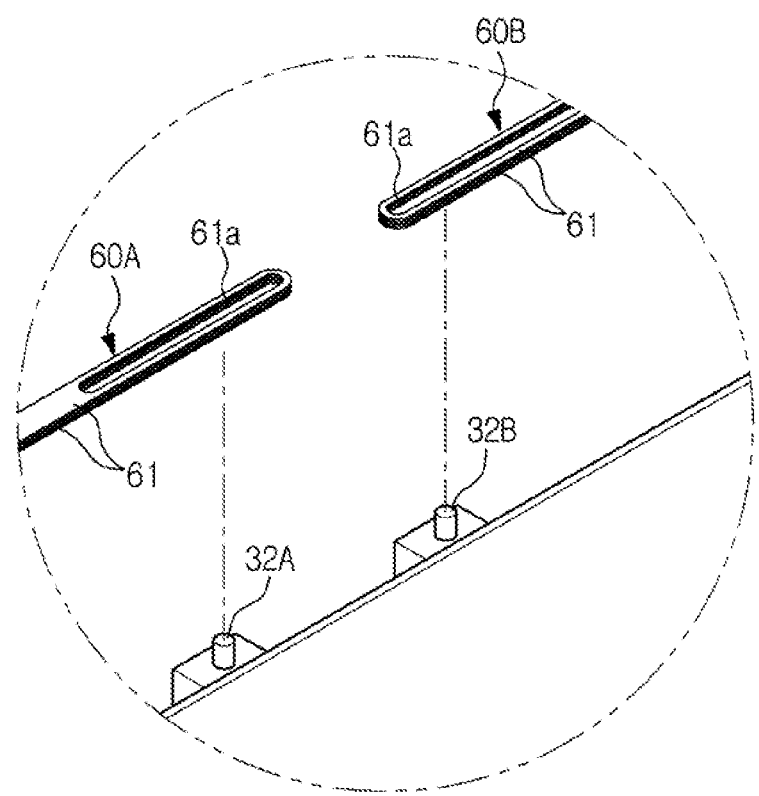
FIG. 7 is an enlarged view of a part B of FIG. 3.
Figure 8:
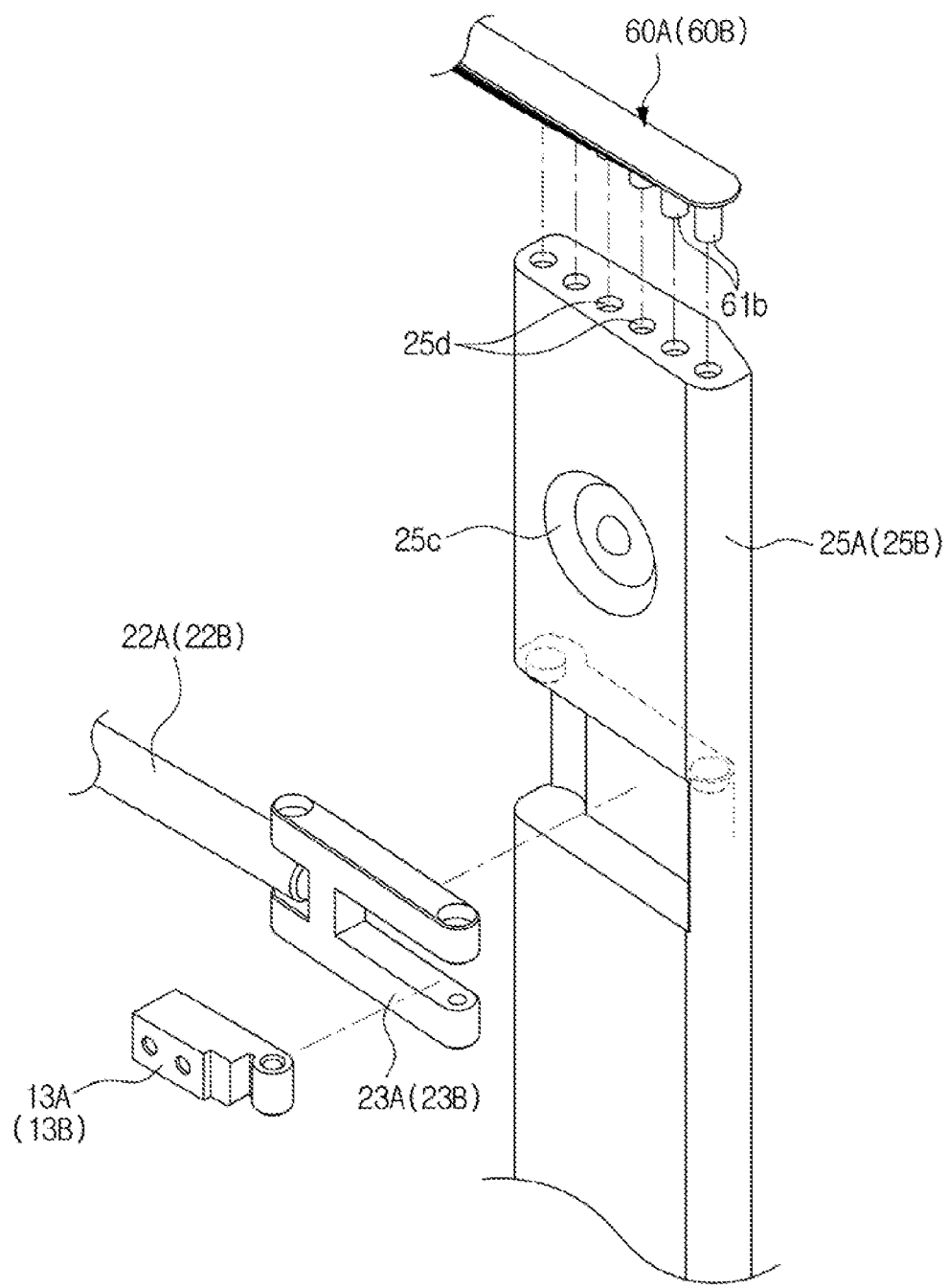
FIG. 8 is an exploded perspective view showing an installation state of a shield member and a cover unit, in the display apparatus according to an exemplary embodiment.

Each of the first and second cover units 60A and 60B may include, as shown in FIGS. 6 to 8, a plurality of cover members 61 where each of the cover members 61 has a shape of a plate extending in a widthwise direction W of the display module 10 and that are stacked vertically (i.e. in a height-wise direction H of the display module 10). First ends of the cover members 61 of the first cover units 60A may be rotatably and movably connected to the center part of the base frame 30, and second ends of the cover members 61 of the first cover units 60A may be rotatably connected to the upper and lower ends of the first shield member 25A. Similarly, first ends of the cover members 61 of the second cover units 60B may be rotatably and movably connected to the center part of the base frame 30, and second ends of the cover members 61 of the second cover units 60B may be rotatably connected to the upper and lower ends of any one of the second shield member 25B. The cover units 60A and 60B are examples of covering means and cover a gap created between the display module 10 and the side case 40.

In order for the first ends of the cover members 61 to be rotatably and movably connected to the center part of the base frame 30 and the respect shield members 25A and 25B as described above, a plurality of guide holes 61a extending horizontally (i.e., on a plane formed by axes extending in a widthwise direction W and a thickness-wise direction T of the display module 10) may be formed at the first ends of the cover members 61, and a plurality of hinge protrusions 61b may be formed along a line at the second ends of the cover members 61 such that the hinge protrusions 61b are rotatably coupled with the upper or lower ends of corresponding shield members 25A and 25B.

Respectively, as shown in FIGS. 3 and 4, in the upper and lower ends of the center part of the base frame 30 along a widthwise direction H of the display module 10, a pair of first guide pins 32A may be provided to pass through the guide holes 61a formed in the cover members 61 of the first cover units 60A, and a pair of second guide pins 32B may be formed to pass through the guide holes 61a formed in the cover members 61 of the second cover units 60B.

Also, on the upper and lower ends of the first and second shield members 25A and 25B, a plurality of hinge grooves 25d with which the hinge protrusions 61b provided on the cover members 61 are rotatably coupled may be arranged along a line.

Hereinafter, the display apparatus 1 configured as described above will be described in detail with reference to the accompanying drawings.

If a user manipulates an input unit, such as a remote controller or a button provided on the display apparatus 1 while the display module 10 is in the flat state, the driving motor 211 may operate to rotate the pinion 212 in a direction, so that the first rack 214A interlocked with the upper part of the pinion 212 may move toward one lateral edge of the display module 10 according to the rotation of the pinion 212, and the second rack 214B interlocked with the lower part of the pinion 212 may move in a direction that is opposite to the movement direction of the first rack 214A referring to FIG. 5.

As the two first moving members 22A are connected to the first rack 214A through the first connecting member 24A, the first moving members 22A may move toward one lateral edge of the display module 10 together with the first rack 214A. Also, as the two second moving members 22B are connected to the second rack 214B through the second connecting member 24B, the second moving members 22B may move toward the other lateral edge of the display module 10 together with the second rack 214B. The movements of the first moving members 22A and the second moving members 22B may be guided by the movement guides 31 arranged on the base frame 30.

According to the movement of the first moving members 22A, the first rotating members 23A may rotate with respect to first ends connected to the first moving members 22A to push a first lateral edge of the display module 10 forward along a thickness-wise direction T of the display module 10, and according to the movement of the second moving members 22B, the second rotating members 23B may rotate with respect to first ends connected to the second moving members 22B to push a second lateral edge of the display module 10 forward along a thickness-wise direction T of the display module 10.

Accordingly, because both lateral edges of the display module 10 protrude forward by the first rotating members 23A and the second rotating members 23B, while the center part of the display module 10 is fixed on the base frame 30, as shown in FIG. 2, the display module 10 may be transformed to a curved shape in which both lateral edges of the display module 10 protrude forward.

As the first shield member 25A and the second shield member 25B are respectively connected to the first rotating members 23A and the second rotating members 23B and the first shield member 25A and the second shield member 25B may rotate together with the first rotating members 23A and the second rotating members 23B.

Figure 9:
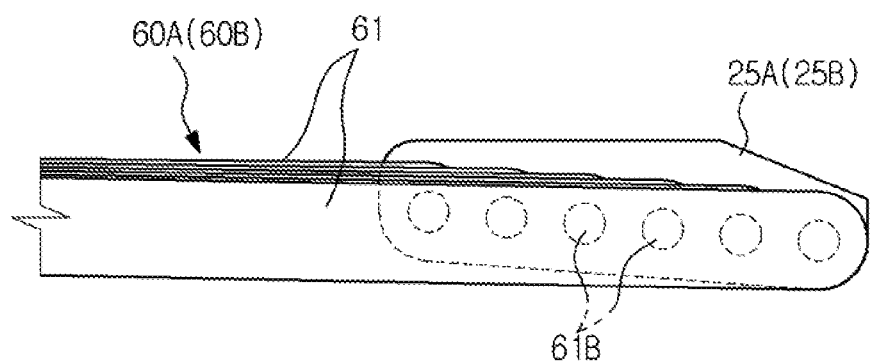
FIG. 9 is a plane view for describing operation of the cover unit when the display module is in the flat state, in the display apparatus according to an exemplary embodiment.
Figure 10:
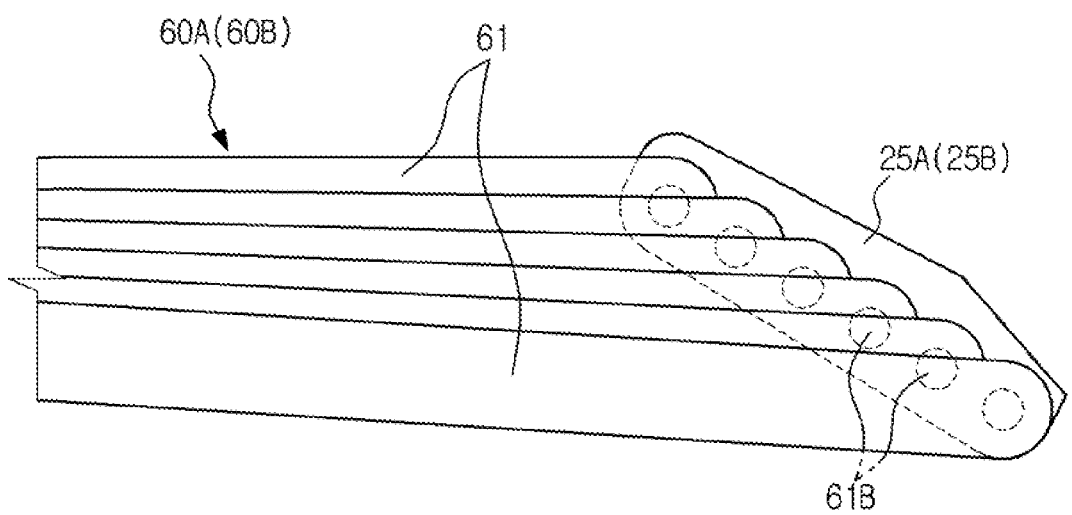
FIG. 10 is a plane view for describing operation of the cover unit when the display module is in the curved state, in the display apparatus according to an exemplary embodiment.

The cover members 61 of the cover units 60A and 60B may overlap each other vertically, as shown in FIG. 9 while the display module 10 is in the flat state, and if the first shield member 25A and the second shield member 25B rotate as the display module 10 is transformed to the curved state, the cover members 61 of the four cover units 60A and 60B may move and rotate with respect to the guide pins 32A and 32B to spread in a fan shape as shown in FIG. 10, thus covering respective the upper and lower portions of spaces between the display module 10 and the base frame 30 or the side case 40 at both lateral ends of the display module 10.

Accordingly, the cover units 60A and 60B may prevent foreign materials such as dust from getting into the display apparatus 1 through the upper and lower portions of spaces between the display module 10 and the base frame 30 or the side case 40 when the display module 10 is in the curved state.

In the exemplary embodiment described above, an example in which the display apparatus 1 includes the display panel 11 configured with OLEDs has been described, however, the display panel 11 is not limited to an OLED panel. For example, the display apparatus 1 may include a Liquid Crystal Display (LCD) panel.

In the exemplary embodiment, the cover units 60A and 60B are configured to cover the upper and lower portions of space between the display module 10 and the base frame 30 or the side case 40 when the display module 10 is in the curved state, however, the configuration of the cover units 60A and 60B is not limited thereto. For example, the cover units 60A and 60B can be configured to cover only the upper portions of spaces between the display module 10 and the base frame 30 or the side case 40 when the display module 10 is in the curved state.

In the exemplary embodiment, the first shield member 25A and the second shield member 25B may be configured to be able to rotate with respect to the display module 10 through the first rotating members 23A and the second rotating members 23B, however, the configuration of the first shield member 25A and the second shield member 25B is not limited thereto. For example, the first shield member 25A and the second shield member 25B may be rotatably connected to the display module 10.

Also, the display apparatus 1 may include a remote controller (not shown) or a button (not shown), and when a user manipulates the remote controller or the button, the display module 10 may be transformed to any one of a flat state and a curved state.

Alternatively, the display module 10 may be automatically transformed to a flat state or a curved state by the transform unit 20 according to a type of content that is to be displayed on the display module 10.

For example, if information representing that content to be displayed on the display module 10 is content such as news is input to the display apparatus 1, the display module 10 may be transformed to a flat state by the transform unit 20, and if information representing that content to be displayed on the display module 10 is movie is input to the display apparatus 1, the display module 10 may be transformed to a curved state by the transform unit 20.

At this time, information about a type of content may be input directly by a user through the button, or received from a transmitter such as a broadcasting company together with image signals.

Also, in the exemplary embodiment, the display module 10 is transformed to any one state between a flat state and a curved state at a predetermined curvature, however, the transformation of the display module 10 is not limited thereto. For example, the curvature of the display module 10 may be adjusted within a predetermined curvature range continuously or by stages according to a user's selection. That is, when the user presses the button, the curvature of the display module 10 may be adjusted continuously in proportion to a time period for which the user presses the button, or by stages in proportion to the number of times by which the user presses the button.

Also, in the current embodiment, the display module 10 is entirely curved at a predetermined curvature, however, the display module 10 is not limited to this. According to design, the display module 10 may be curved only at its center part and maintained in a flat state at its both lateral edges, or the display module 10 may be curved at different curvatures at its center part and at its both lateral edges.

Hereinafter, a display apparatus according to another exemplary embodiment will be described with reference to the accompanying drawings.

Figure 11:
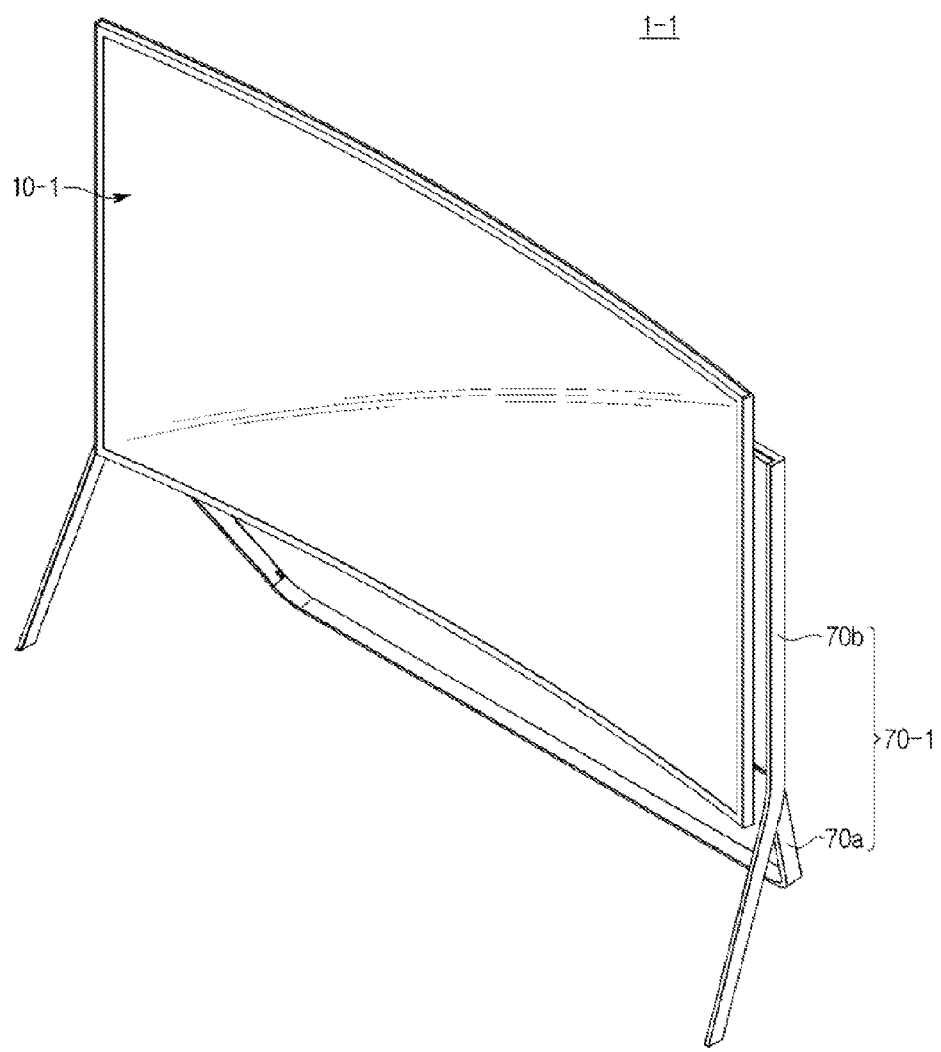
FIG. 11 is a perspective view of the display apparatus according to an exemplary embodiment, when the display module is in the curved state.
Figure 12:
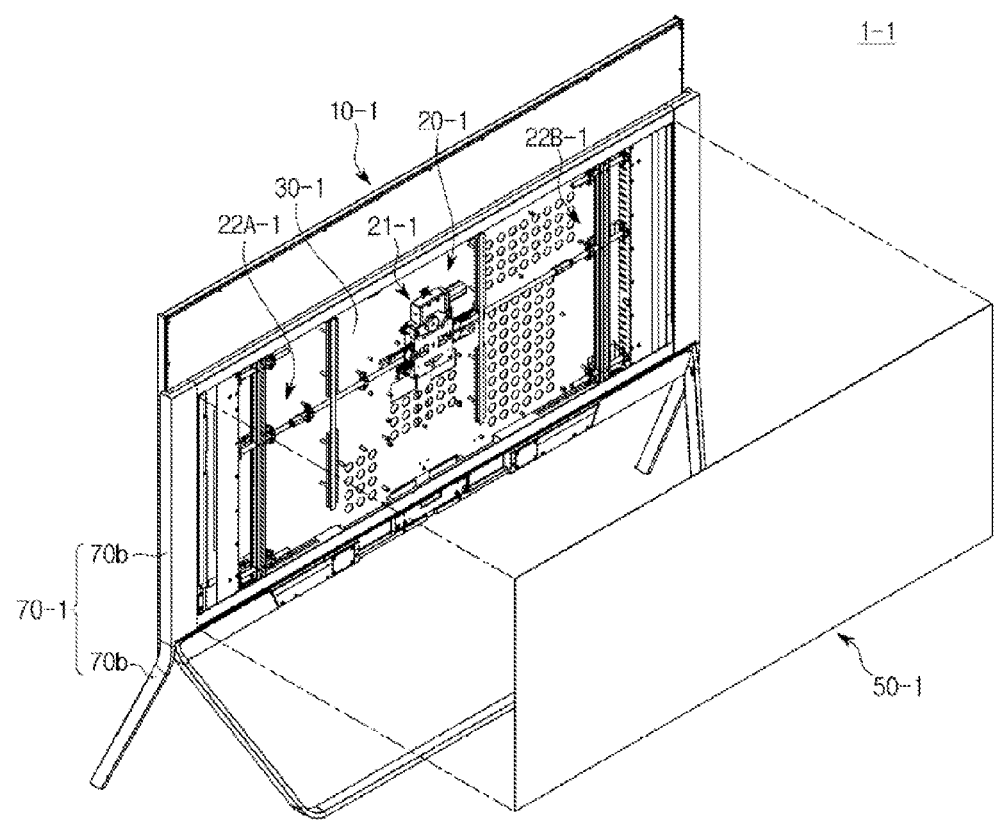
FIG. 12 is a rear perspective view of the display apparatus according to an exemplary embodiment, when a rear case is detached from the display apparatus.
Figure 13:
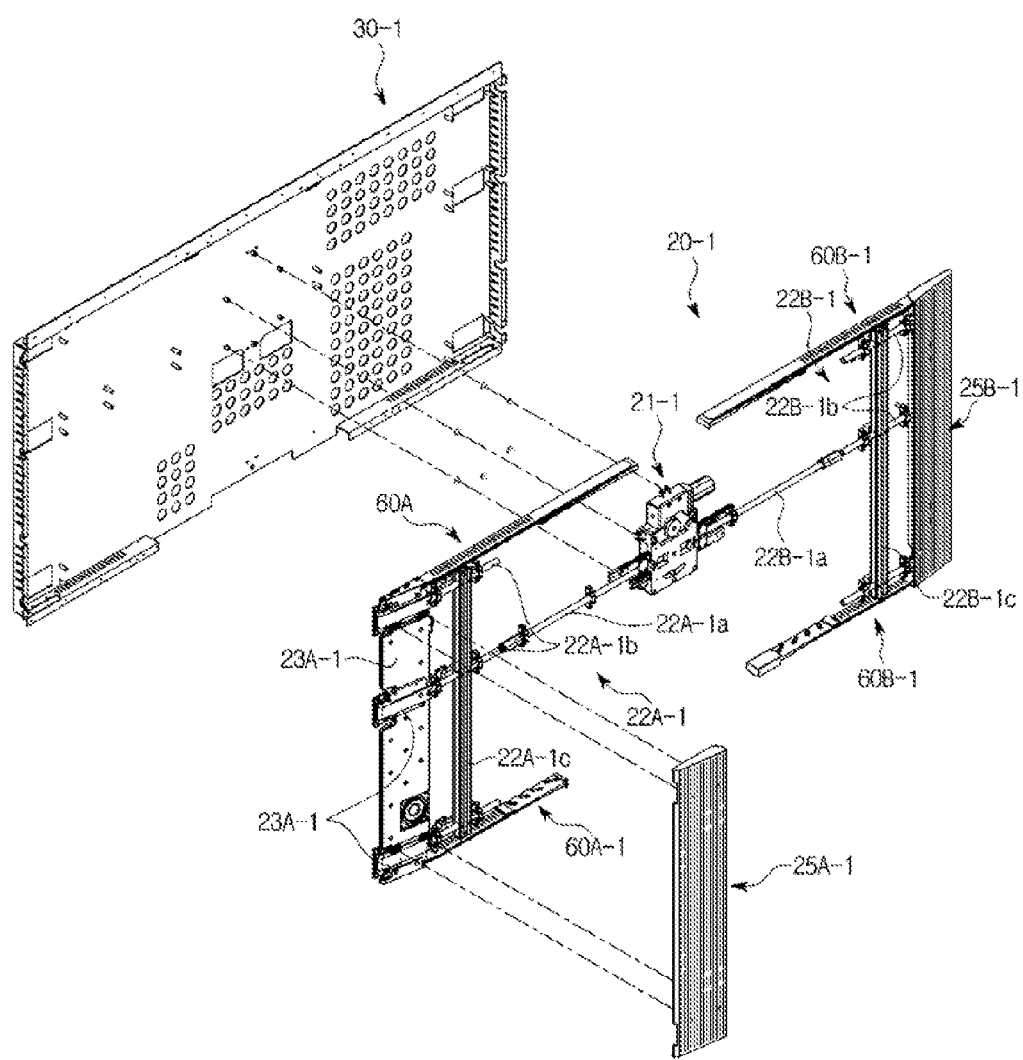
FIG. 13 is a rear perspective view of the display apparatus according to an exemplary embodiment, showing an installation state of a transform unit.

As shown in FIGS. 11 to 13, a display apparatus 1-1 according to a second exemplary embodiment may include a display module 10-1 which can be transformed to a flat state and a curved state, a transform unit 20-1 configured to transform the display module 10-1, a base frame 30-1 on which the transform unit 20-1 is disposed, and a rear case 50-1 disposed behind the base frame 30-1 and configured to cover the transform unit 20-1.

In addition, the display apparatus 1-1 may include a stand 70-1 to enable the display apparatus 1-1 to stand upright on a horizontal plane such as a floor. In the exemplary embodiment, the stand 70-1 may include a holder 70a that is supported on a horizontal plane, and a support 70b that extends from the holder 70a and is fixed to the base frame 30-1.

In the exemplary embodiment, the base frame 30-1 and the rear case 50-1 may have a height that is shorter than a height of the display module 10-1 so that the rear, upper part of the display module 10-1 is exposed to the outside in the rear, in order to look like the display apparatus 10-1 has a thin thickness-wise.

The transform unit 20-1 may include a driver 21-1 configured to generate power, a plurality of moving members 22A-1 and 22B-1 configured to move by receiving power from the driver 21-1, and a pair of rotating members 23A-1 and 23B-1 configured to rotate with respect to the moving members 22A-1 and 22B-1 and to move both lateral edges of the display module 10-1 forward and backward in a thickness-wise direction T of the display module 10-1. In the exemplary embodiment, each of the rotating members 23A-1 and 23B-1 may be provided as three separate members that are spaced and arranged in the upper, center, and lower areas in a height-wise direction H of the display module 10-1 of each lateral edge of the rear part of the display module 10-1. The moving members 22A-1 and 22B-1 may include a pair of first links 22A-1a and 22B-1a configured to move in opposite directions by the driver 21-1, a pair of three second links 22A-1b and 22B-1b respectively connected to the pair of three rotating members 23A-1 and 23B-1, and a pair of third links 22A-1c and 22B-1c configured to connect the three second links 22A-1b and 22B-1b spaced apart vertically to each other.

Also, the display apparatus 1-1 may include two pairs of cover units 60A-1 and 60B-1 and a pair of shield members 25A-1 and 25B-1 to cover spaces between the display module 10-1 and the base frame 30-1 when the display module 10-1 is in a curved state.

The pair of shield members 25A-1 and 25B-1 may be used to cover spaces between the display module 10-1 and the base frame 30-1 at both lateral ends along a widthwise direction H of the display module 10-1 when the display module 10-1 is in the curved state. The pair of shield members 25A-1 and 25B-1 may be connected to the rotating members 23A-1 and 23B-1 arranged vertically to rotate together with the rotating members 23A-1 and 23B-1.

Figure 14:
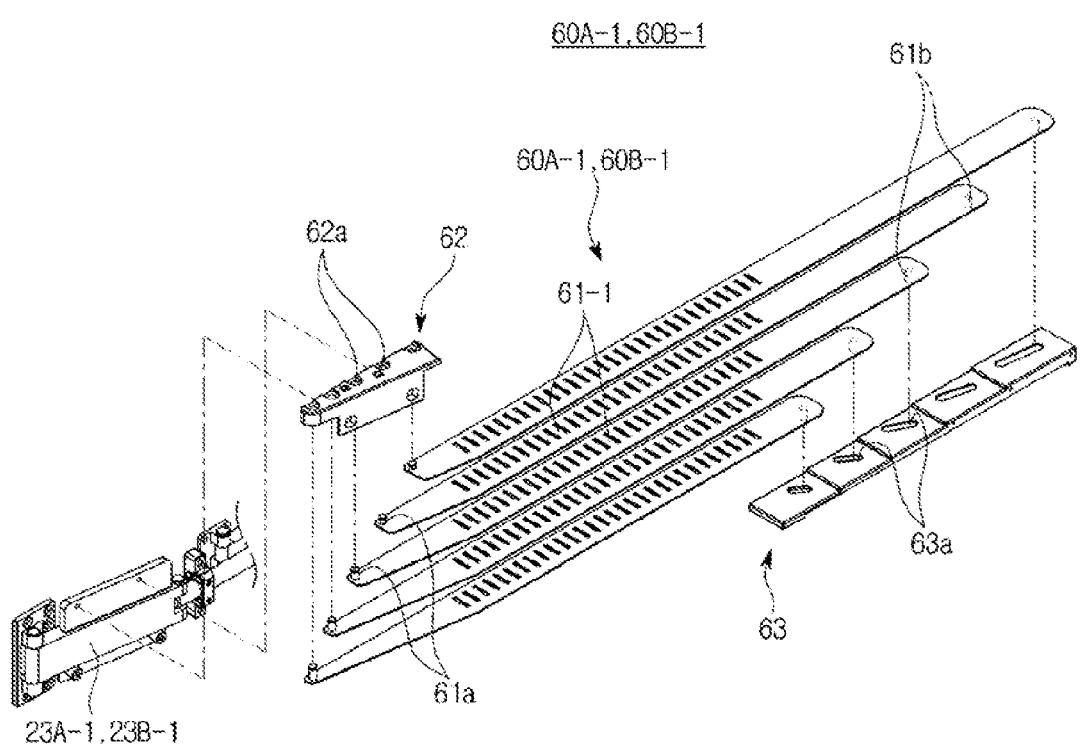
FIG. 14 is an exploded perspective view of a cover unit, in the display apparatus according to an exemplary embodiment.

The two pairs of cover units 60A-1 and 60B-1 may be disposed such that first ends of the cover units 60A-1 and 60B-1 are rotatably connected to the upper and lower ends of the shield members 25A-1 and 25B-1, and second ends of the cover units 60A-1 and 60B-1 are rotatably connected to the base frame 30-1, as shown in FIG. 14. Accordingly, the cover units 60A-1 and 60B-1 may rotate with respect to the second ends to spread according to rotation of the rotating members 23A-1 and 23B-1. In the exemplary embodiment, five cover members 61-1 may be provided to correspond to each of the upper and lower edges of the display module 10-1 at both lateral ends of the display module 10-1.

The upper and lower rotating members of the rotating members 23A-1 and 23B-1 may be connected to a plurality of first rotation guide members 62 to which first ends of the cover members 61-1 are rotatably connected, and in the base frame 30-1, a plurality of second rotation guide members 63 to which the other ends of the cover members 61-1 are rotatably connected may be provided.

The cover members 61-1 may include a plurality of hinge protrusions 61a and 61b that are rotatably coupled with the first rotation guide members 62 and the second rotation guide members 63. Each first rotation guide member 62 may include a plurality of hinge grooves 62a with which the hinge protrusions 61a formed in first ends of the cover members 61-1 are rotatably coupled, and each second rotation guide member 63 may include a plurality of guide grooves 63a with which the hinge protrusions 61b formed at second ends of the cover members 61-1 are rotatably and movably coupled.

Figure 15:
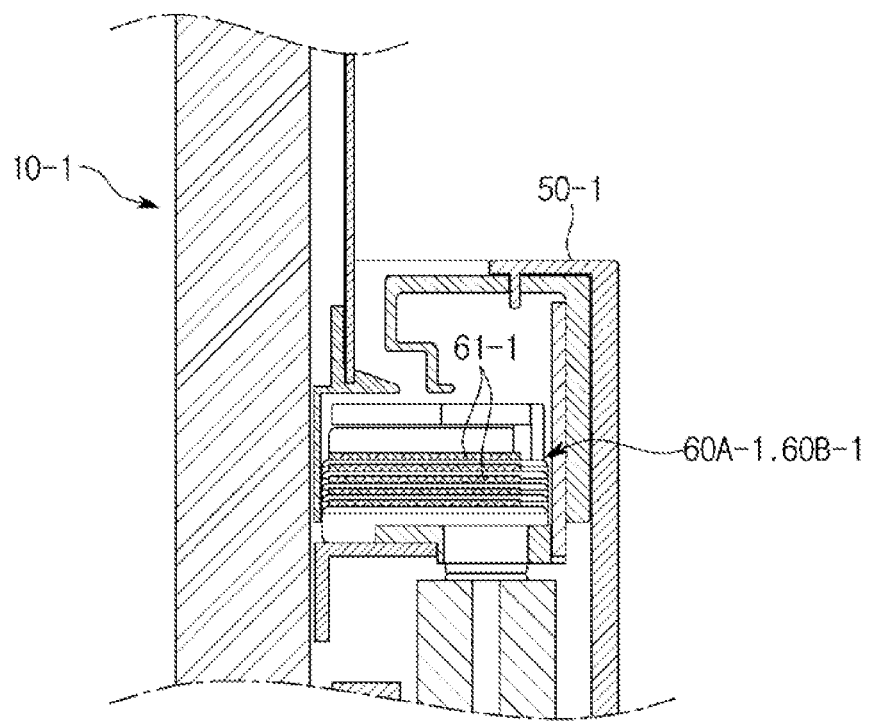
FIG. 15 is a cross-sectional view of the cover unit, in the display apparatus according to an exemplary embodiment.
Figure 16:
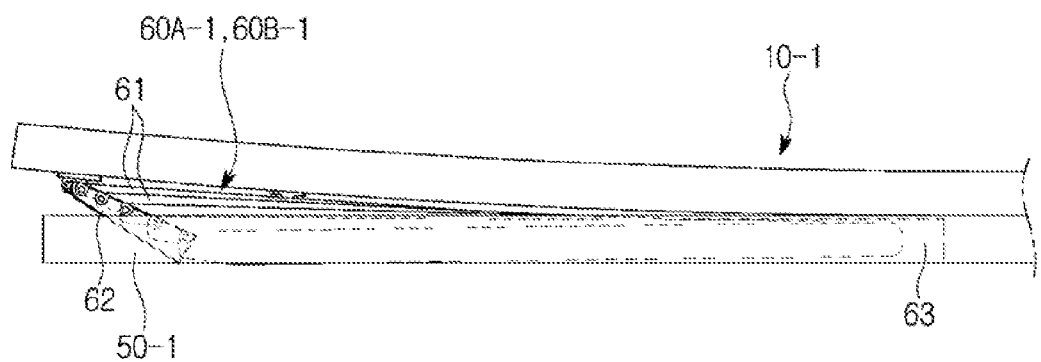
FIG. 16 is a plane view showing a state in which the cover unit spreads, in the display apparatus according to an exemplary embodiment.

Accordingly, the cover members 61-1 overlap vertically when the display module 10-1 is in a flat state, as shown in FIG. 15, and when the display module 10-1 is transformed to a curved state, the cover members 61-1 may spread to cover spaces between the display module 10-1 and the rear case 50-1, as shown in FIG. 16.

As described above, in the display apparatus according to exemplary embodiments, since the cover members of the cover units spread to cover the upper and lower portions of spaces between the display module and the side case at both lateral ends of the display module when the display module is transformed to a curved state, it is possible to prevent foreign materials from getting into the display apparatus through the upper and lower portions of spaces between the display module and the side case.

Although exemplary embodiments have been particularly shown and described above, it would be appreciated by those skilled in the art that changes may be made therein without departing from the principles and spirit of the inventive concept, the scope of which is defined by the following claims.

What is claimed is:

1. A display apparatus comprising:
a display module configured to be changed to a curved state from a flat state, the display module comprising:
a first lateral edge portion; and
a second lateral edge portion, the first and the second lateral edge portions protruding forward in the curved state, the first lateral edge portion being opposite to the second edge portion in a widthwise direction of the display module;
a base frame disposed behind the display module;
a shield member provided at one of the first lateral end portion and the second lateral end portion of the display module; and
a cover unit comprising:
a first end being connected to the shield member;
a second end opposite from the first end of the cover unit, the second end connected to the base frame and configured to cover a space between the one of the first the second lateral end portions of the display module and the base frame in response to the display module being in the curved state; and
a plurality of cover members having shapes of plates, extending in a widthwise direction of the display module and being stacked vertically.

2. The display apparatus according to claim 1,
wherein a cover member of the plurality of cover members comprises a first end rotatably and movably connected to the base frame and a second end rotatably connected to the shield members.

3. The display apparatus according to claim 2, wherein the shield member comprises:
a first shield member; and
a second shield member, the first and the second shield members respectively connected to the first and the second lateral end portions of the display module,
wherein the cover unit comprises:
a first cover unit; and
a second cover unit,
wherein the first cover unit comprises:
a first end connected to a center part of the base frame; and
a second end connected to the first shield member and configured to cover at least one portion of upper and lower portions of spaces between the display module and a side case at the first lateral edge portion in response to the display module being in the curved state, and
wherein the second cover unit comprises:
a first end connected to the center part to the base frame; and
a second end connected to the second shield member and configured to cover at least one portion of upper and lower portions of spaces between the display module and the side case at the second lateral edge portion in response to the display module being in the curved state.

4. The display apparatus according to claim 3, wherein the base frame comprises:

a first guide pin configured to movably and rotatably support a first end of the plurality of cover members of the first cover unit; and a second guide pin configured to movably and rotatably support a first end of the plurality of cover members of the second cover unit, wherein the first shield member comprises a plurality of hinge grooves with which a second end of the plurality of cover members of the first cover unit is rotatably coupled and the second shield member comprises a plurality of hinge grooves with which a second end of the plurality of cover members of the second cover unit is rotatably coupled, wherein the first ends of the plurality of cover members of the first and second cover units comprise a guide hole extending horizontally and through which respective first and second guide pins pass therethrough, and wherein a second end of the plurality of cover members of the first and second cover units comprises a hinge protrusion rotatably coupled with respective plurality of hinge grooves of the first and second shield members.

5. The display apparatus according to claim 4, wherein the first guide pin and the second guide pin are provided in at least one of an upper-center part and a lower-center part of the base frame, and wherein the plurality of hinge grooves are provided in at least one of an upper end and a lower end of the first and second shield members.

6. The display apparatus according to claim 3, wherein the cover unit comprises:

a pair of first cover units configured to cover the upper and lower portions of spaces between the display module and the side case at the first lateral end when the display module is in the curved state; and a pair of second cover units configured to cover the upper and lower portions of spaces between the display module and the side case at the second lateral end when the display module is in the curved state.

7. The display apparatus according to claim 3, wherein the cover unit comprises:

a first cover unit configured to cover the upper portion of spaces between the display module and the side case at the first lateral end when the display module is in the curved state; and a second cover unit configured to cover the upper portion of spaces between the display module and the side case at the second lateral end when the display module is in the curved state.

8. The display apparatus according to claim 1, further comprising a side case configured to cover top, bottom, left, and right side surfaces of the display module when the display module is in a flat state, wherein the cover unit is configured to cover at least one of upper and lower portions of spaces between the display module and the side case in response to the display module being the curved state.

9. The display apparatus according to claim 1, further comprising a transform unit provided on the base frame and configured to transform the display module, and a rear case disposed behind the base frame and configured to cover the transform unit, wherein a height of the rear case is smaller than a height of the display module.

10. The display apparatus according to claim 9, wherein the transform unit comprises:

a driver configured to generate power, a pair of moving members configured to move in opposite directions from each other by the driver; and a plurality of rotating members rotatably connected to the pair of moving members and configured to rotate according to movements of the moving members to move the first and second lateral edges of the display module forward or backward.

11. A display apparatus comprising:

a display device comprising:
a first surface configured to display an image; and
a second surface opposite to the first surface;

a base member provided at the second surface of the display device;

a side case surrounding the display device and the base member;

a shield device provided at one of a first lateral end portion and a second lateral end portion, the first lateral edge portion being opposite to the second edge portion in a widthwise direction of the display device, the shield device provided in an interior of the side case in response the display device being in a flat state and extending in a height-wise direction of the display device; and a cover device provided in the interior of the side case in response the display device being in a flat state, the cover device comprising:

a first end connected to the shield member;

a second end being opposite to the first end and being connected to the base frame; and a plurality of cover members having shapes of plates, extending in a widthwise direction of the display module and being stacked vertically, wherein in response to the display device being in the flat state, the side case covers top, bottom, left, and right side surfaces of the display apparatus, wherein in response to the display device being in a curved state, the shield device and the cover device together cover the at least one of upper, lower and side portions of spaces formed between the display device and the side case of the display apparatus, wherein lateral end portions of the base member is configured to remain in a flat state in response to the display device being in the curved state.

12. The display apparatus according to claim 11, wherein the shield device comprises a first shield device provided at a first lateral end of the display device and a second shield device provided at a second lateral end opposite to the first lateral end of the display device.

13. The display apparatus according to claim 11, wherein the cover device comprises:

a pair of first cover devices configured to cover upper and lower portions of gaps between the display device and the side case at the first lateral end when the display device is when in the curved state; and a pair of second cover devices configured to cover upper and lower portions of gaps between the display device and the side case at the second lateral end when the display device is in the curved state.

14. The display apparatus according to claim 11, wherein in response to the display device being in the curved state, the shield device is configured to provide a vertical surface extending in the height-wise direction of the outer surfaces, and wherein the cover device is configured to provide a horizontal outer surface extending perpendicularly from the vertical surface of the outer surfaces of the display apparatus.

15. The display apparatus according to claim 11, wherein in response to the display device being in the curved state, the shield device is configured to provide a vertical surface extending in the height-wise direction of the outer surfaces, and wherein the cover device is configured to provide a horizontal outer surface extending perpendicularly from the vertical surface of the outer surfaces of the display apparatus.

16. The display apparatus according to claim 11, wherein the first end of the cover device comprises a plurality of hinge protrusions protruding in the height-wise direction and the shield device comprises a plurality of hinge grooves corresponding to the plurality of hinge protrusions and configured to rotatably support the first end of the cover device.

17. The display apparatus according to claim 16, wherein the plurality of hinge grooves are provided in at least one of an upper-most end and a lower-most end in the height-wise direction of the shield device.

18. The display apparatus according to claim 11, wherein the second end of the cover device comprises a guide hole and the base frame comprises a guide pin corresponding to the guide hole and configured to movably and rotatably support the second end of the cover device.

19. The display apparatus according to claim 18, wherein the guide pin is provided in at least one of an upper-center part and a lower-center part of the base frame.

20. The display apparatus according to claim 11, further comprising a transform unit provided on the base frame and configured to transform the display device between the flat state and the curved state.

21. A display apparatus comprising: a display means configured to display an image;

a transforming means for transforming the display means between a flat state and a curved state;

a casing means for providing outer surfaces of the display means, lateral end portions of the casing means remaining in a flat state in response the display means being transformed to the curved state; and a covering means for covering a gap created between the display means and the casing means in response to the display means changing from the flat state to in the curved state, wherein the covering means comprises a second covering means for covering a horizontal outer surface of the gap between the display means and the casing means.

22. The display apparatus according to claim 21, wherein the covering means further comprises:

a first covering means for covering a vertical outer surface of the gap between the display means and the casing means.

* * * * *